(12) United States Patent
Ishii et al.

(10) Patent No.: US 6,455,945 B1
(45) Date of Patent: Sep. 24, 2002

(54) SEMICONDUCTOR DEVICE HAVING A FRAGMENT OF A CONNECTION PART PROVIDED ON AT LEAST ONE LATERAL EDGE FOR MECHANICALLY CONNECTING TO ADJACENT SEMICONDUCTOR CHIPS

(75) Inventors: Masanori Ishii; Hidetake Suzuki; Yoji Suzuki, all of Yamanashi (JP)

(73) Assignee: Fujitsu, Limited, Kawasaki (JP)

( * ) Notice: Subject to any disclaimer, the term of this patent is extended or adjusted under 35 U.S.C. 154(b) by 0 days.

(21) Appl. No.: 09/270,843

(22) Filed: Mar. 18, 1999

Related U.S. Application Data

(62) Division of application No. 08/355,481, filed on Dec. 14, 1994, now Pat. No. 5,919,713.

(30) Foreign Application Priority Data

Jan. 28, 1994 (JP) .............................................. 6-008851

(51) Int. Cl.[7] ...................... H01L 23/544; H01L 27/02; H01L 25/65; H01L 23/538; H01L 23/34
(52) U.S. Cl. ...................... 257/797; 257/723; 257/777; 257/686; 257/685; 257/730; 257/620; 257/621
(58) Field of Search ............................... 257/706, 797, 257/723, 730, 724, 686, 685, 620, 777, 621

(56) References Cited

U.S. PATENT DOCUMENTS

| | | | | |
|---|---|---|---|---|
| 3,864,018 A | * | 2/1975 | Miller | |
| 4,308,090 A | * | 12/1981 | Velde et al. | 438/619 |
| 4,338,620 A | * | 7/1982 | Kawabe | 257/520 |
| 4,630,096 A | * | 12/1986 | Drye et al. | |
| 4,893,163 A | * | 1/1990 | Rudeck | 257/797 |
| 4,961,821 A | | 10/1990 | Drake et al. | 950/647 |
| 4,990,462 A | * | 2/1991 | Sliwa, Jr. | 148/DIG. 28 |
| 4,997,521 A | * | 3/1991 | Howe et al. | 156/651 |
| 5,041,190 A | | 8/1991 | Drake et al. | 156/647 |
| 5,091,769 A | * | 2/1992 | Eichelberger | |
| 5,136,354 A | | 8/1992 | Morita et al. | 357/40 |
| 5,198,963 A | * | 3/1993 | Gupta et al. | 361/715 |
| 5,221,642 A | * | 6/1993 | Burns | |
| 5,393,706 A | | 2/1995 | Mignardi et al. | 437/226 |

(List continued on next page.)

FOREIGN PATENT DOCUMENTS

| | | |
|---|---|---|
| JP | 56-6451 | 1/1981 |
| JP | 61-30048 | 2/1986 |
| JP | 1-48423 | 2/1989 |
| JP | 2-148739 | 6/1990 |

*Primary Examiner*—Alexander O. Williams
(74) *Attorney, Agent, or Firm*—Armstrong, Westerman & Hattori, LLP

(57) ABSTRACT

A method for fabricating a semiconductor device includes the steps of forming a plurality of semiconductor chips on a semiconductor substrate, forming a connection part such that the connection part connects the semiconductor chips with other across an dicing line, bonding the semiconductor substrate upon a support substrate, removing the dicing region while maintaining the semiconductor chips in a state such that the semiconductor chips are bonded upon the support substrate, detaching the plurality of semiconductor chips from the support substrate while maintaining an alignment between the semiconductor chips, and separating the semiconductor chips from each other by eliminating the connection part.

4 Claims, 6 Drawing Sheets

U.S. PATENT DOCUMENTS

| | | | |
|---|---|---|---|
| 5,434,094 A | | 7/1995 | Kobiki et al. .................. 437/40 |
| 5,482,887 A | | 1/1996 | Duinkerken et al. ........... 437/62 |
| 5,485,038 A | * | 1/1996 | Licori et al. ................. 257/758 |
| 5,532,519 A | * | 7/1996 | Bertin et al. ................. 257/777 |
| 5,563,470 A | * | 10/1996 | Li ............................... 313/496 |
| 5,684,333 A | * | 11/1997 | Moriyama ................... 257/797 |
| 5,700,732 A | * | 12/1997 | Jost et al. .................... 438/401 |
| 5,791,484 A | * | 8/1998 | Ikeda et al. .................. 206/717 |
| 5,801,452 A | * | 9/1998 | Farnworth et al. ........... 257/797 |
| 5,917,237 A | * | 6/1999 | Furuno et al. ............... 257/676 |
| 5,925,937 A | * | 7/1999 | Jost et al. .................... 257/979 |
| 5,977,618 A | * | 11/1999 | DiStefano et al. ........... 257/674 |
| 5,981,302 A | * | 11/1999 | Alswede et al. .............. 438/15 |
| 5,986,341 A | * | 11/1999 | Usami et al. ................ 257/723 |
| 5,994,768 A | * | 11/1999 | Fogelson .................... 257/666 |
| 6,008,530 A | * | 12/1999 | Kano ......................... 257/686 |
| 6,025,638 A | * | 2/2000 | Pogge et al. ................. 257/797 |
| 6,075,280 A | * | 6/2000 | Yung et al. .................. 257/797 |
| 6,171,976 B1 | * | 1/2001 | Cheng ........................ 438/760 |

\* cited by examiner

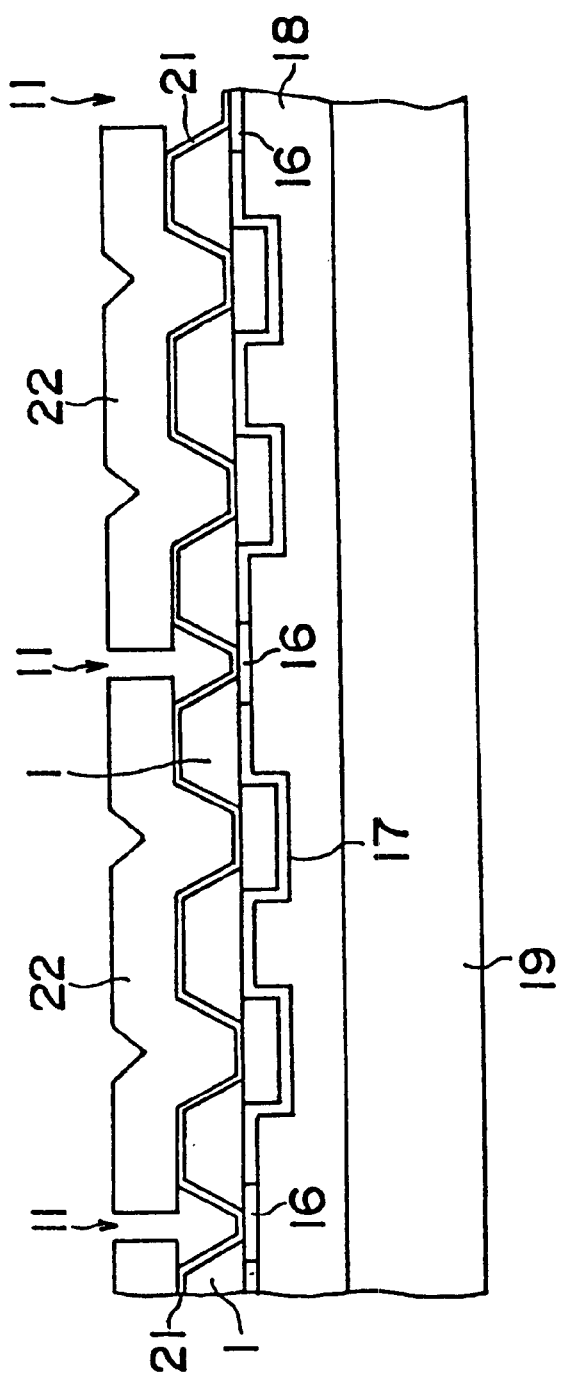
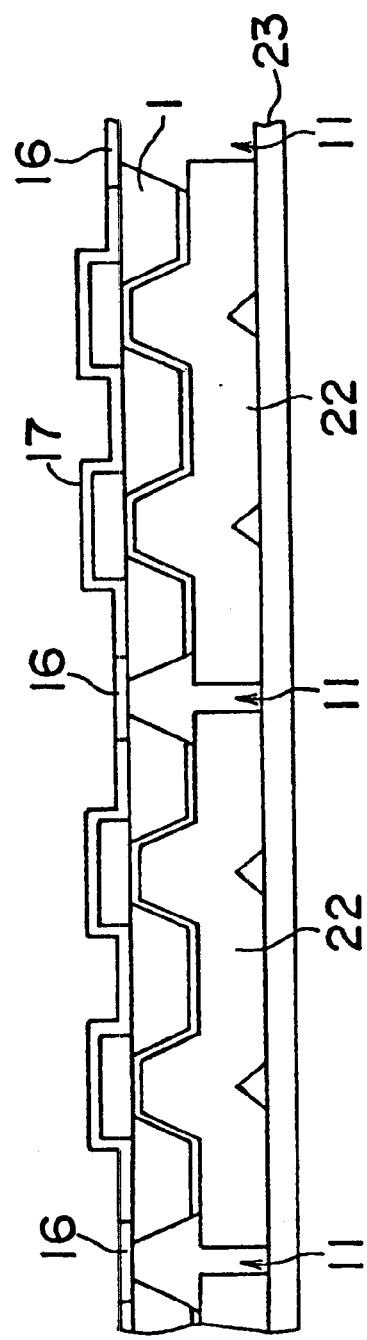
FIG. 2D
FIG. 2E

SEMICONDUCTOR DEVICE HAVING A FRAGMENT OF A CONNECTION PART PROVIDED ON AT LEAST ONE LATERAL EDGE FOR MECHANICALLY CONNECTING TO ADJACENT SEMICONDUCTOR CHIPS

This application is a division of prior application Ser. No. 08/355,481 filed Dec. 14, 1994, now U.S. Pat. No. 5,919,713.

BACKGROUND OF THE INVENTION

1. Field of the Invention

The present invention generally relates to semiconductor devices, and more particularly to a fabrication process of a high power semiconductor device having the PHS (plated heat sink) structure. Further, the present invention relates to a semiconductor device fabricated according to such a fabrication process.

2. Description of the Related Art

In high power semiconductor devices, it is necessary to dissipate heat as efficiently as possible. For this purpose, such high power semiconductor devices use a semiconductor substrate having a thickness reduced as much as possible, in combination with the so-called PHS (plated heat sink) structure in which a metal layer is provided on the rear side of the substrate as a heat sink. Such a PHS structure is also useful in high speed semiconductor devices such as GaAs FET or HEMT for minimizing the length of the ground conductor pattern. In such semiconductor devices, throughholes are formed in a substrate of the device in correspondence to the source region, and the source electrode is connected to a grounded metal layer provided on the rear side of the substrate via the through-holes. Thereby, the problem of reduced gain, caused by the inductance of the conductor pattern that connects the source electrode to the ground, is successfully eliminated.

When fabricating a semiconductor device having the PHS structure, semiconductor chip patterns are formed on a surface of a semiconductor substrate that has an ordinary thickness. Next, the substrate is turned over and fixed upon a slab such as a glass substrate by means of wax, such that the front surface of the substrate faces the glass substrate. In this state, the rear side of the semiconductor substrate is ground uniformly by means of a back-grinder tool and diamond abrasives. Further, a chemical etching process is applied to reduce the thickness of the substrate to a thickness less than 50 $\mu$m. After such a process, a resist pattern is provided on the rear side of the semiconductor substrate in correspondence to an electrode pattern on the front side of the substrate, and a plating is conducted on the rear side of the substrate while using the resist pattern as a mask to form an electrode pattern on the rear side of the substrate. After the individual semiconductor devices are formed as such, the substrate is divided into respective chips by conducting a dicing process. Typically, the substrate is cut by means of a dicing saw or etched along a dicing line defined on the surface of the substrate.

When fabricating a semiconductor device having a through-hole in the substrate, the substrate upon which the semiconductor devices are formed is mounted upon a slab or support substrate similarly as before, and the resist pattern is formed on the rear side of the semiconductor substrate so as to expose the region in which the through-hole is to be formed. Further, the resist pattern is formed to expose the foregoing dicing line. By conducting an etching process, the semiconductor substrate is divided into semiconductor chips separated from each other, and the through hole is formed in each of the semiconductor chips at the same time. When the etching is completed, the semiconductor chips are held upon the foregoing glass substrate by a wax, and an electrode is formed on the exposed rear side of the substrate by a plating process so as to fill the through-hole, while simultaneously protecting the dicing region by a resist pattern. The electrode thus formed also acts a heat sink. After the formation of the rear electrode, individual semiconductor chips are separated from the glass substrate by dissolving the wax by a suitable solvent.

In the foregoing fabrication process, it should be noted that the completed semiconductor chips are in alignment on the glass substrate as long as the chips are fixed thereupon by means of wax. On the other hand, once the wax is dissolved, the alignment of the chips is lost and the semiconductor chips are intermixed. Thereby, the use of an automatic assembling process, such as the one that uses an automatic chip-bonder apparatus, makes it difficult for constructing the semiconductor device in the form of semiconductor package.

In the foregoing processes, it should be noted that the front surface of the substrate is contacted with the glass substrate in a state in which the chips are aligned on the glass substrate, and it is the rear side of the chip, which carries the foregoing heat sink electrode, that is exposed for accessing from the outside. As a result, picking up of the semiconductor chips and assembling the same into a semiconductor package inevitably becomes a complex process, and because of this, there has been a difficulty in the mass production of the semiconductor device having the PHS structure.

SUMMARY OF THE INVENTION

Accordingly, it is a general object of the present invention to provide a novel and useful fabrication process of a semiconductor device and a semiconductor device fabricated according to such a process wherein the foregoing problems are eliminated.

Another and more specific object of the present invention is to provide a fabrication process of a semiconductor device having a PHS structure including a step of mounting a semiconductor substrate, on which a plurality of semiconductor chips are formed, on a support substrate, wherein the alignment of the semiconductor chips is maintained even when the semiconductor chips are separated from each other and detached from the support substrate.

Another object of the present invention is to provide a process for fabricating a semiconductor device, comprising the steps of:

(a) forming a plurality of semiconductor devices on a semiconductor substrate, such that the semiconductor devices are separated from each other by a dicing region;

(b) forming a connection part on the dicing region such that said connection part mechanically connects said semiconductor devices with each other;

(c) separating said plurality of semiconductor devices from each other except for said connection part, by removing the dicing region selectively; and (d) separating the plurality of semiconductor devices from each other by eliminating a mechanical connection formed by said connection part.

Another object of the present invention is to provide a semiconductor device, comprising:

a semiconductor chip defined by lateral edges; and a fragment of a connection part provided at least on one of said lateral edges for maintaining an alignment with another semiconductor chip, the connection part having a width smaller than a size of the lateral edge on which the connection part is provided and is provided for mechanically connecting adjacent semiconductor chips with each other.

According to the present invention, the semiconductor devices are connected with each other mechanically by means of the connection part, even in the state in which the separation region is removed. Thus, the alignment of the semiconductor devices is maintained even after the step for separating the semiconductor devices from the support substrate, and it becomes possible to apply an automatic assembling process for assembling a semiconductor package that uses a PHS semiconductor chip. Further, the present invention is not only effective in such an automatic assembling process but also in the manual assembling process in which the semiconductor chips are picked up manually. Because of the alignment of the semiconductor chips, the work load of the worker for picking up the semiconductor chip manually is substantially reduced.

According to the preferred embodiment of the present invention, the step (c) includes a step of bonding the semiconductor substrate a support substrate by means of a bonding medium such that each of the semiconductor devices on the semiconductor substrate has a surface thereof engaged upon a surface of the support substrate. The step of removing the dicing region is conducted, in the step (c), in a state that the semiconductor devices are bonded upon the support substrate. Thereby, it is possible to remove the dicing region and separate the semiconductor devices into respective chips while maintaining the alignment between the semiconductor devices. Further, such a step for removing the dicing region may be conducted simultaneously with the process for forming a via hole through the semiconductor devices. Thus, the process of the present invention is suitable for fabricating the semiconductor devices having the so-called PHS structure.

According to another preferred embodiment of the present invention, the step (d) comprises the sub-steps of: detaching the semiconductor devices from the support substrate by removing the bonding medium while maintaining the state in which the semiconductor devices are connected with each other mechanically by the connection part; bonding a rear side of the semiconductor devices, after being detached from the support substrate, upon a sticky medium; and disconnecting the connection part. According to the present invention, the semiconductor chips are held on the sticky medium while maintaining mutual alignment after the connection part is broken.

According to another preferred embodiment of the present invention, the step (b) comprises the sub-steps of: depositing a protective layer upon the semiconductor substrate such that the protective layer covers each of the semiconductor devices including the separation region; and patterning the protective layer to form a connection part such that the connection part connects the semiconductor devices with each other. According to the present invention, one can form the connection part as a part of the protective layer or passivation film and no extraneous deposition process is required to form the connection part.

According to another preferred embodiment of the present invention, the step of patterning the protective layer is conducted to form a device surface region that is a part of the protective layer covering the principal surface of the semiconductor device, such that the connection part is isolated from the device surface region. According to the present invention, the stress applied to the connection part for causing a fracture therein does not propagate to the chip surface region, and the protective layer covering the chip surface is kept free from damage.

According to another preferred embodiment of the present invention, the step (b) comprises a sub-step (b-1) of depositing a layer having a composition different from the semiconductor substrate, upon the semiconductor substrate, such that the layer covers continuously those regions of the substrate in which the semiconductor devices are formed and those regions in which the isolation region is formed, and wherein the step (a) includes a step of forming an active part on the layer formed by the step (b-1). According to the present invention, one can form the connection part as a part of the semiconductor layer such as a buffer layer that forms the semiconductor device. Thereby, it is possible to reduce the number of steps for forming the connection part.

According to another preferred embodiment of the present invention, the step (d) includes a step for deforming the sticky medium to break the connection part. According to the present invention, the separation of the semiconductor chips is achieved easily by merely expanding or deforming the sticky medium or sheet.

According to another preferred embodiment of the present invention, the step (d) includes a step for etching the connection part away. According to he present invention, it is possible to take up the semiconductor chips that are separated from each other as a result of etching of the connection part, from the support substrate to a suitable medium such as a sticky tape. Thereby, it is possible to eliminate the process to apply stress for breaking the connection part, and the risk that the semiconductor chip is damaged as a result of the mechanical breaking of the connection part is substantially reduced.

According to another preferred embodiment of the present invention, the step of etching is conducted while using a metal layer covering a rear principal surface of the semiconductor devices as a mask. Thereby, one can eliminate the masking process for masking the substrate by photoresist.

According to another preferred embodiment of the present invention, the sticky medium is a sheet that is laterally expandable, and wherein the step of deforming the sticky medium comprises the steps of: expanding the sheet to increase a distance between adjacent semiconductor devices to break the connection part; and picking up the semiconductor chips. According to the present invention, it is possible to separate the individual semiconductor chips easily.

Other objects and further features of the present invention will become apparent from the following detailed description when read in conjunction with the attached drawings.

BRIEF DESCRIPTION OF THE DRAWINGS

FIGS. 2A–2E are diagrams showing the fabrication process of the semiconductor device according to the foregoing first embodiment;

DETAILED DESCRIPTION OF THE PREFERRED EMBODIMENT

Figure 1:
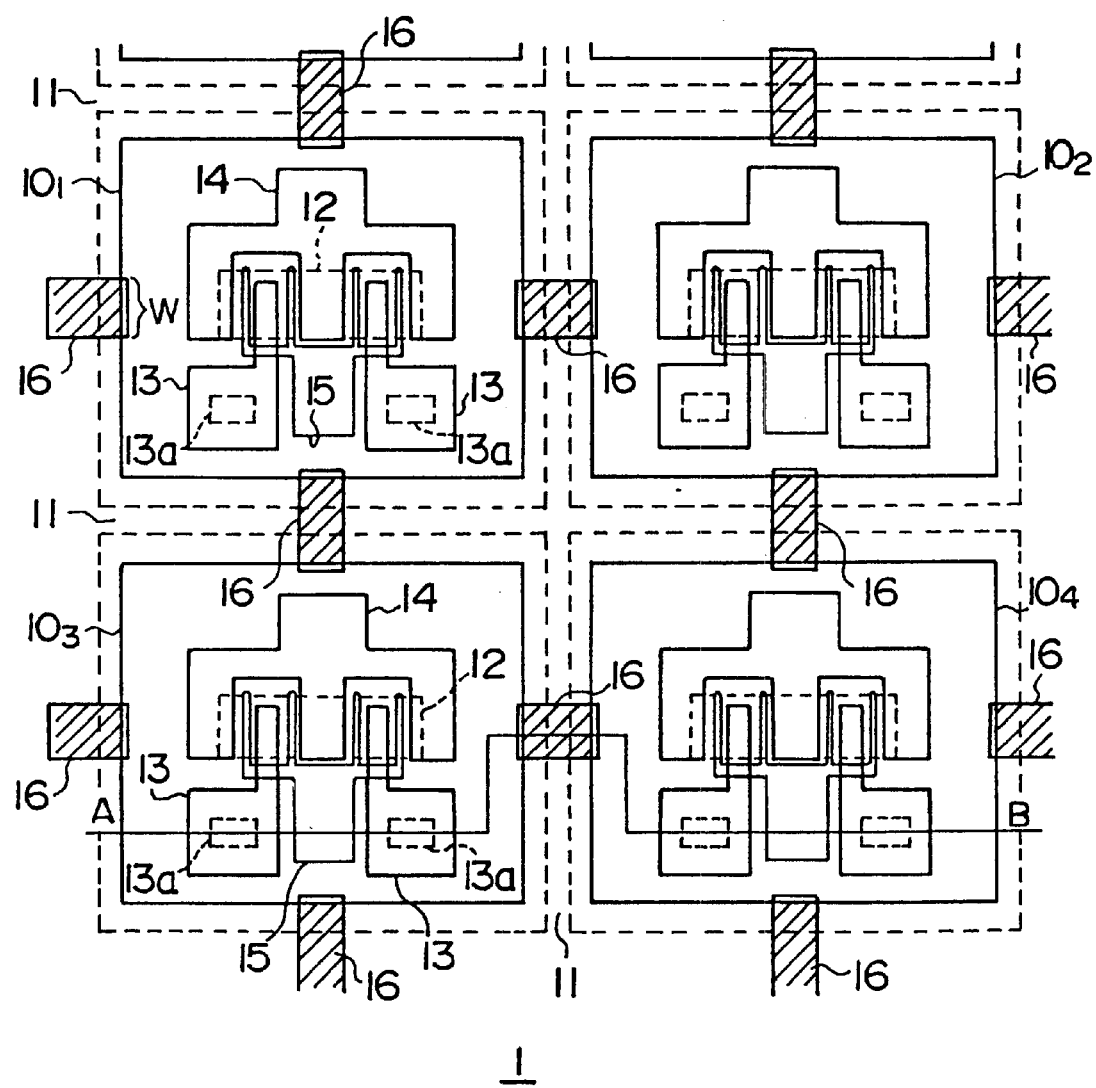
FIG. 1 is a diagram showing the construction of a half-product obtained in the fabrication process according to a first embodiment of the present invention in a plan view.

FIG. 1 is a plan view showing the construction of a GaAs FET according to a first embodiment of the present invention.

Referring to FIG. 1, there is provided a semiconductor substrate 1 in which a number of semiconductor devices 101, 102, 103, 104, . . . are formed. Further,-it will be noted that a dicing region 11 is formed on the substrate 1 similar to a grid for separating the semiconductor chips from each other. Each of the semiconductor devices 101, 102, . . . includes an active region 12 of a GaAs FET, and the active region 12 carries thereon a source electrode 13, a drain electrode 14 and a gate electrode 15 as usual in GaAs FETs. It should be noted that the illustrated GaAs FET is the one designed for ultra-high frequency application and includes a through-hole 13a penetrating from a front side to a rear side of the substrate 1, so as to minimize the length of the ground conductor extending from the source electrode 13.

In the state of the GaAs FET of FIG. 1, it should be noted that each semiconductor device such as the device 101 is formed on a corresponding chip, and the chips are mechanically connected to adjacent chips by means of a connection part 16 that bridges across the foregoing dicing region 11. In the example of FIG. 1, the connection part 16 forms a part of the passivation film that covers the surface of the semiconductor chip. Thus, the connection part 16 is formed on a front side of the substrate 1 and is typically formed of an insulating material such as $SiO_2$ with a thickness of about 0.5 $\mu$m. In the embodiment of FIG. 1, it should be noted that the connection region 16 has a width w that is substantially smaller than the edge of the semiconductor chip, wherein each edge carries one such connection part 16. Of course, it is possible to provide a plurality of connection parts 16 for each edge. Further, it is not necessary to provide the connection part 16 on all of the edges of the chip.

The semiconductor substrate thus formed with the semiconductor chips and the connection parts 16 is then subjected to an etching process, wherein the dicing region 11 is removed as a result of the etching and one obtains a structural body formed of the semiconductor chips connected with each other by the foregoing connection part 16 alone. In such a structural body, the alignment between the plural semiconductor chips is maintained because of the mechanical connection achieved by the connection part 16.

Next, the structural body is attached to a dilatational medium such as a flexible adhesive tape, and the tape is deformed together with the structural body thereon. As a result, the connection part 16 is broken and the semiconductor chips are separated from each other. It should be noted that the connection part 16, forming a part of the passivation film, has an extremely reduced thickness and breaks easily. As the semiconductor chips are held on the adhesive tape, the chips are not mixed up even when separated from each other. The semiconductor chips thus held on the tape are supplied to an automatic assembling device for assembling a package.

Next, the fabrication process of the semiconductor device according to the present invention will be described with reference to FIGS.2A - 2E showing a cross sectional view of the device along a line A-B shown in FIG. 1.

Figure 2A:
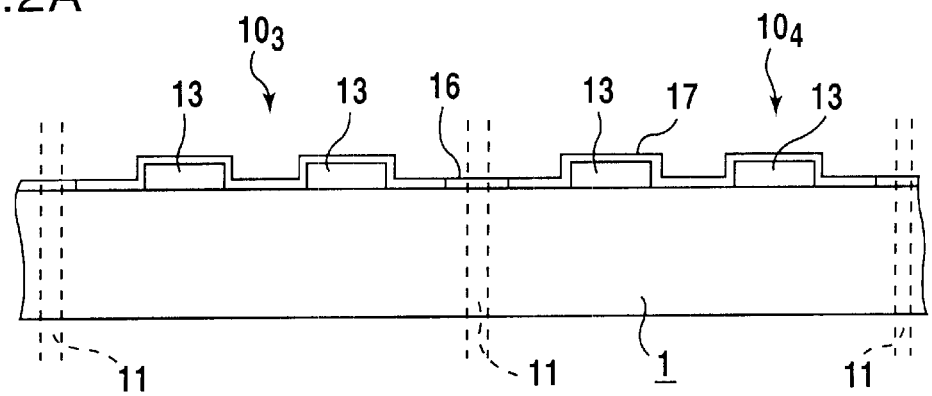

Referring to FIG. 2A, the semiconductor devices 101, . . . are formed on the GaAs substrate 1 first, and an $SiO_2$ passivation film 17 is deposited on the substrate 1 with a thickness of about 0.5 $\mu$m so as to cover the electrodes 13–15 on the substrate surface. The passivation film 17 is then subjected to a patterning process, and the connection part 16 is formed so as to bridge across the dicing region 11.

Figure 2B:
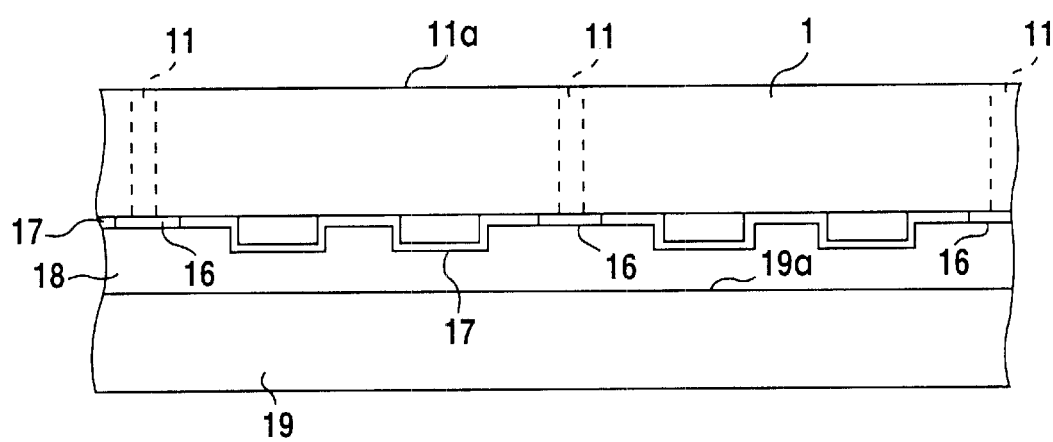

Next, in the step of FIG. 2B, the substrate 1 is turned over and mounted upon a support substrate 19 of a glass, such that the passivation film 17 on the substrate surface 1 faces a principal surface 19a of the support substrate 19. Thereby, it should be noted that the support substrate 19 carries a wax layer 18 on the foregoing principal surface 19a and the semiconductor substrate 1 is held firmly upon the support substrate 19 by means of the wax layer 18. In the state of FIG. 2B, a rear surface 11a of the substrate 1 is subjected to a mechanical grinding process, followed by a chemical etching process, such that the substrate 11 has a reduced thickness of about 25 Am. The etching is typically made by an aqueous solution of $H_2SO_4$ and $H_2O_2$.

Figure 2C:
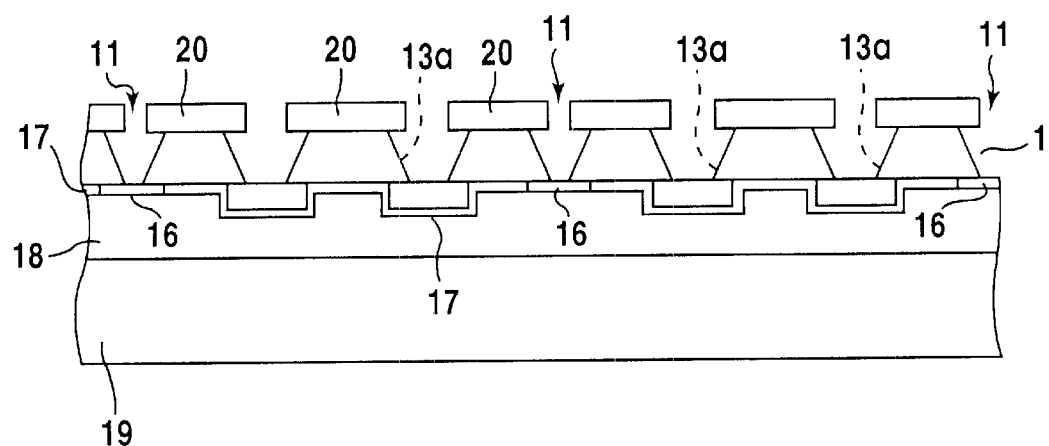

Next, a resist layer 20 is provided on the foregoing rear surface 11a of the substrate 1, followed by a photolithographic patterning process to form an opening in correspondence to the dicing region 11 as well as in correspondence to the region of the substrate 1 where a through-hole 13a is to be formed. Further, the substrate 1 is subjected to a wet etching process in an aqueous solution of $H_2SO_4$ and $H_2O_2$, while using the resist layer 20 thus patterned as a mask. Thereby, the dicing region 11 is etched selectively as indicated in FIG. 2C, and the through-hole 13a is formed simultaneously. Thus, the semiconductor chips are separated from each other on the support substrate 19 except for the foregoing rigid connection part 16 that bridges across the semiconductor chips.

Next, the resist pattern 20 is removed and a layer of Ni—Cr alloy and a layer of Au are deposited on the exposed rear surface of the substrate 1 sequentially by a vacuum deposition process with respective thicknesses of 50 nm and 100 nm. As a result, an electrode layer 21 having a NiCr/Au structure is formed on the rear surface of the substrate 1 such that the electrode layer 21 covers the via hole 13a as well as the dicing region 11. See the structure of FIG. 2D.

Further, the region of the electrode layer 21 corresponding to the dicing region 11 is covered by a resist pattern, and an electroplating process is conducted on the foregoing electrode layer 21 except for the dicing region 11 to grow a thick Au layer with a thickness of about 30 $\mu$m. After removal of the resist pattern, one obtains the structure shown in FIG. 2D.

Next, the electrode layer 21 is removed from the dicing region 11 by means of an etching process while using the Au layer 22 as a mask, and one obtains a structural body in which the semiconductor chips are connected with each other solely by the extremely thin connection part 16 while the thick Au layer 22 is grown on the NiCr/Au electrode 21 except for the dicing region 11. In this state, the wax layer 18 is quietly dissolved by an organic solvent, and the semiconductor chips are detached from the support substrate 19 while maintaining alignment of the semiconductor chips.

In the state immediately after removal of the wax layer 18, the structural body formed of the semiconductor chips connected with each other by the connection part 16 is supported detachably on the support substrate 19 by gravity. Thus, a sticky flexible tape 23 is disposed on the support substrate 19 such that tape 23 is urged against the structural body. Thereby, the structural body sticks to the tape 23 and the structural body is lifted up together with the tape 23 as indicated in FIG. 2E, wherein FIG. 2E shows the structural body and the tape 23 in the turned over state. By causing a deformation of the tape 23 in the state of FIG. 2E, the connection part 16 is broken and the semiconductor chips are separated from each other while being held upon the tape 23 with a mutual alignment. Such a deformation of the tape 23 may be achieved by merely expanding the tape 23 laterally. Thereby, the separation between the semiconductor chips is increased and the connection part 16 is broken. As a result, one obtains a structure shown in FIG. 3 on the tape 22.

Figure 3:
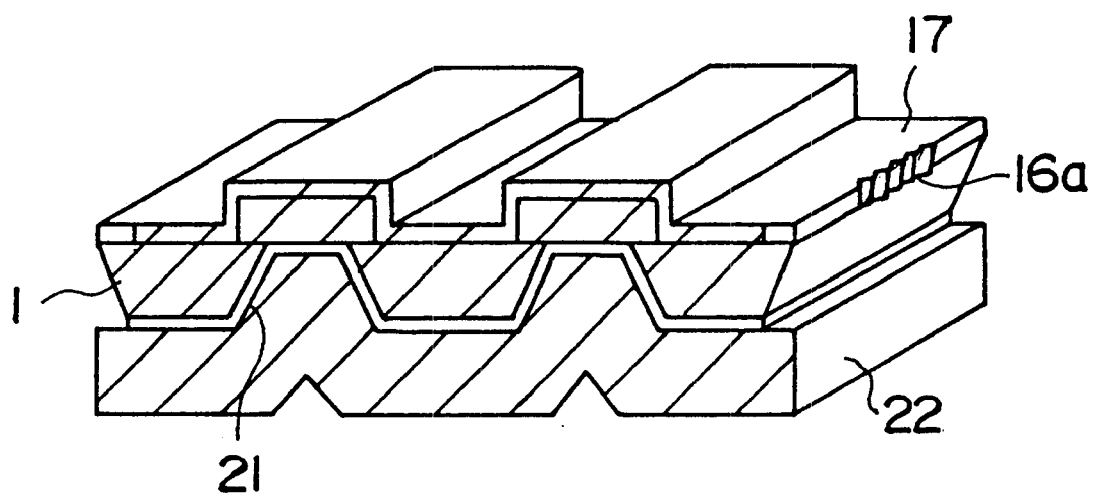
FIG. 3 is a diagram showing a semiconductor chip obtained by the first embodiment process in a perspective view.

In such a construction shown in FIG. 3, the chips are held on the tape 23 in alignment with each other and with a uniform mutual separation. Thus, the tools used for assembling a package such as a pickup collet is positioned easily upon the semiconductor chip, and automatic assembling of the package can be conducted easily. In the case of manual assembling process in which the semiconductor chips are picked up manually, the present invention is effective for reducing the work load of the worker substantially.

It should be noted that the removal of the connection part 16 may be conducted before the structural body of the semiconductor chips is held upon the tape 23. For example, one may remove the foregoing connection part 16 after the wax layer is dissolved, by means of a dry etching process that uses a mixture of $CF_4$ and $O_2$ as an etching gas. Even in such a case, the alignment of the semiconductor chips is maintained on the support substrate 19 unless a large external shock is applied. Thus, by taking up the semiconductor chips on an adhesive tape from the support substrate 19 while maintaining the alignment of the chips, it is possible to supply the semiconductor chips to automatic assembling apparatuses in the state suitable for automatic assembling process. In the foregoing process, it should be noted that the metal layer provided on the rear side of the chip as a PHS electrode or heat sink, acts also as an etching mask when conducting the dry etching process. Thus, it is possible to reduce the masking process.

In the foregoing embodiment, it is also possible to apply a high pressure jet of high purity water to break the connection part 16 while holding the tape 23 on the tape. It should be noted that FIG. 3 shows the semiconductor chip obtained after such a process in a perspective view.

Referring to FIG. 3, it will be noted that the semiconductor chip has a surface covered by the passivation film 17 and carries the Au electrode 22 on a rear surface. Further, it will be noted that there is formed an irregular fracture surface 16a on a part of the passivation film 17 where the connection part 16 has been provided. As explained previously, it is not always necessary to provide the connection part 16 on each edge of the chip. In other words, the connection part 16 may be provided on a specific edge of the chip. In this case, it becomes possible to determine the chip orientation based upon the edge that carries the fracture surface 16a. On the other hand, it is also possible to form a plurality of connection parts 16 on a single chip edge. In such a case, it is possible to identify the type of the chip based upon the fracture surface 16a, provided that the number of the connection parts 16 and/or the width of the connection part 16 is changed depending upon the type of the chip. Further, the edge on which the connection part 16 is provided and/or the location of the connection part 16 on the edge, may be changed depending upon the type of the chip. Further, it is possible to provide the connection part 16 in the form of bar code indicative of chip information, orientation, versions, and the like. Thereby, one can acquire detailed chip information by examining the connection part 16 or the fracture surface 16a. Further, it should be noted that the semiconductor chip shown in FIG. 3 is by no means limited to square or rectangular, but may be formed in any arbitrary shape.

Figure 4:
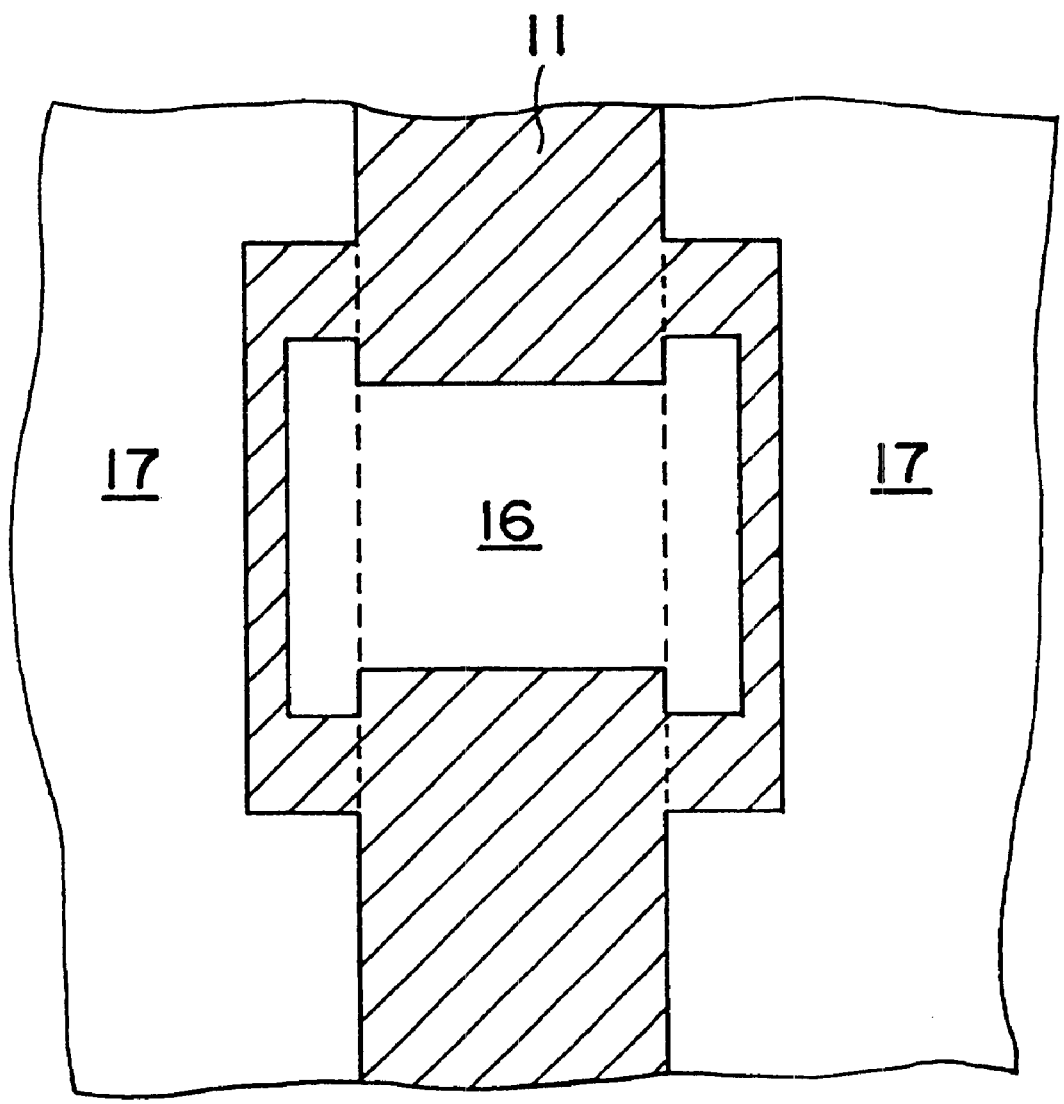
FIG. 4 is a diagram showing a bridging part formed in the fabrication process according to a second embodiment of the present invention in a plan view.

Next, a second embodiment of the present invention will be described with reference to FIG. 4, wherein FIG. 4 shows the connection part 16 in an enlarged scale.

Referring to FIG. 4, the semiconductor substrate 1 has a surface covered by the passivation film 17, wherein the passivation film 17 is so formed to expose the substrate surface in correspondence to the dicing region 11 as indicated by hatching. Further, it will be noted that the connection part 16 is formed as an island region isolated from the passivation film 17 and bridges across the dicing region 11. Because of such a construction of the connection region 16 isolated from the passivation film 17, one can positively avoid the problem of fracture caused in the connection region 16 propagates to the passivation film covering the semiconductor chip.

In the foregoing embodiments, the connection part 16 has been formed as a result of patterning of the $SiO_2$ passivation film 17. However, it should be noted that the connection part 16 is by no means limited to $SiO_2$ but other materials such as SiN, SiON, PSG or polysilicon may be used.

Figure 5A:
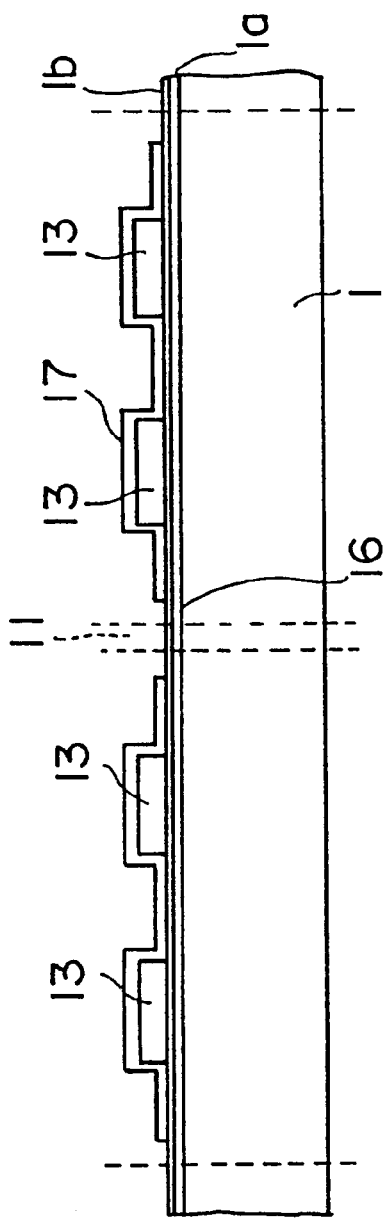
FIGS. 5A and 5B are diagrams showing the fabrication process according to a third embodiment of the present invention.
Figure 5B:
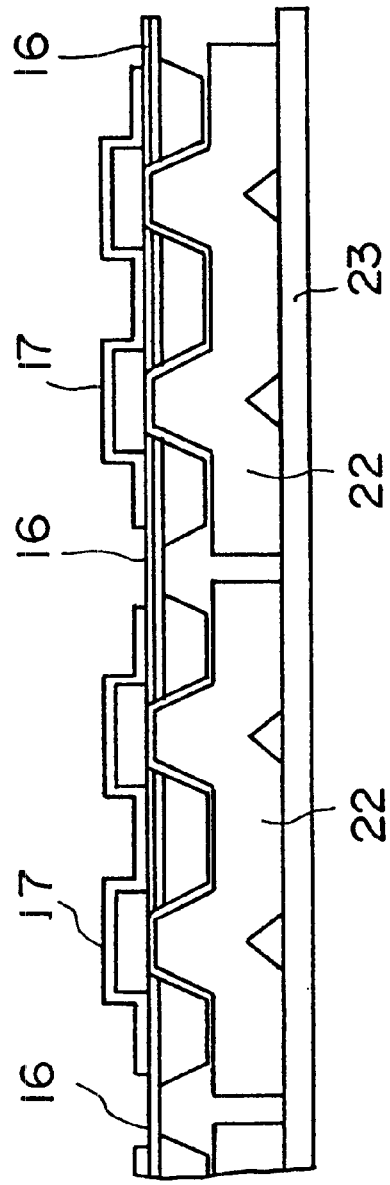

Next, a third embodiment of the present invention will be described with reference to FIGS. 5A and 5B, wherein it will be noted that FIG. 5A shows a state in which the semiconductor chip is covered by the passivation film 17 after the fabrication process of the semiconductor device on the substrate is completed, while FIG. 5B shows a state in which the thickness of the substrate is reduced in the structure of FIG. 5A and the Au electrode 22 is deposited on the rear surface of the chip after the chips are separated from each other by removing the part of the substrate 1 corresponding to the dicing region 11 and the contact hole 13a by etching. As the foregoing processes are substantially identical with those of the first embodiment, the description thereof will be omitted.

Referring to FIG. 5A, a buffer layer 1a of AlGaAs is deposited on the surface of the GaAs substrate 1 with a thickness of about 3 μm, and an active layer 1b of n-type GaAs is deposited on the buffer layer 1a with a thickness of about 0.3 μm. Further, the chip surface is covered with the $SiO_2$ passivation film 17. As already noted, the passivation film 17 is patterned by etching such that the dicing region 11 is exposed.

In the state of FIG. 5B, it should be noted that rear surface of the GaAs substrate 1 is subjected to a dry etching process in correspondence to the dicing region 11 while using a mixed gas of $SiCl_4$ and $SF_6$ as an etching gas, wherein the etching stops automatically upon the exposure of the AlGaAs buffer layer 1a. As result of the etching, the buffer layer 1a and the active layer 1b are left in correspondence to the dicing region 11, and the buffer layer 1a and the active layer 1b form the foregoing connection part 16 that connects the adjacent semiconductor chips across the dicing region 11. The structure thus obtained is attached to the tape 23, and the tape 23 is deformed to break the connection part 16. Thereby, the semiconductor chips are separated from each other while maintaining the alignment on the tape 23. Thus, the present embodiment employs a part of the semiconductor layers that form the semiconductor device for the connection part 16.

Further, the present invention is by no means limited to the embodiments described heretofore, but various variations and modifications may be made without departing from the scope of the invention.

What is claimed is:

1. A semiconductor device, comprising:

a semiconductor chip defined by lateral edges; and a connection part provided at least on one of said lateral edges for maintaining an alignment with another semiconductor chip, said connection part being made of insulative material and having a width smaller than a size of said lateral edge on which said connection part is provided and is provided for mechanically connecting adjacent semiconductor chips with each other.

2. A semiconductor device as claimed in claim 1, wherein said lateral edge is formed with a plurality of said connection parts.

3. A semiconductor device having a plurality of layers, comprising:

a semiconductor chip defined by lateral edges; and a connection part provided at least on one of said lateral edges for maintaining an alignment with another semiconductor chip, said connection part being made of at least one of said plurality of layers and having a width smaller than a size of said lateral edge on which said connection part is provided for mechanically connecting adjacent semiconductor chips with each other.

4. A semiconductor device as claimed in claim 3, wherein said lateral edge is formed with a plurality of said connection parts.

* * * * *